United States Patent
Mehrad et al.

(10) Patent No.: US 7,078,347 B2
(45) Date of Patent: Jul. 18, 2006

(54) METHOD FOR FORMING MOS TRANSISTORS WITH IMPROVED SIDEWALL STRUCTURES

(75) Inventors: Freidoon Mehrad, Plano, TX (US); Scott F. Johnson, Richardson, TX (US); Reji K. Koshy, Rowlett, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/383,090

(22) Filed: Mar. 6, 2003

(65) Prior Publication Data

US 2004/0175911 A1    Sep. 9, 2004

(51) Int. Cl.
*H01L 21/311* (2006.01)
(52) U.S. Cl. .............. 438/696; 438/723; 257/E21.177
(58) Field of Classification Search .............. 438/696, 438/723, 724, 697, 695, 366; 257/E21.177, 257/E21.18
See application file for complete search history.

(56) References Cited

U.S. PATENT DOCUMENTS

| | | | |
|---|---|---|---|
| 5,460,993 A * | 10/1995 | Hsu et al. | 438/231 |
| 6,190,961 B1 * | 2/2001 | Lam et al. | 438/253 |
| 6,194,279 B1 * | 2/2001 | Chen et al. | 438/303 |
| 6,242,334 B1 * | 6/2001 | Huang et al. | 438/595 |
| 6,455,362 B1 * | 9/2002 | Tran et al. | 438/194 |
| 6,610,571 B1 * | 8/2003 | Chen et al. | 438/265 |
| 2002/0192868 A1 * | 12/2002 | Kim | 438/112 |

\* cited by examiner

*Primary Examiner*—Caridad Everhart
(74) *Attorney, Agent, or Firm*—Peter K. McLarty; W. James Brady, III; Frederick J. Telecky, Jr.

(57) ABSTRACT

A gate structure (30) is formed over a semiconductor (10). Sidewall structures (200) of a first width $W_1$ are formed adjacent to the gate structure (30) and source and drain regions (90) are formed in the semiconductor (10). An etch process is performed to reduce the width of the sidewall structure to $W_2$ and silicide regions (110) are then formed adjacent to the sidewall structures (205).

5 Claims, 2 Drawing Sheets

METHOD FOR FORMING MOS TRANSISTORS WITH IMPROVED SIDEWALL STRUCTURES

FIELD OF THE INVENTION

The invention is generally related to the field of integrated circuit manufacture and more specifically to a method of forming metal oxide semiconductor transistors with improved silicide regions.

BACKGROUND OF THE INVENTION

As CMOS technology continues to scale further into the sub-micron region, the width of the gate on metal oxide semiconductor (MOS) transistors is constantly being reduced. MOS transistors gates are formed using a conductive material such as metals, silicides, and doped polycrystalline silicon (polysilicon). For MOS transistor gates formed using doped polysilicon, metal suicides are often formed on the gate structure to reduce the sheet resistance of the gate and to ensure proper electrical contract. The sheet resistance of the gate structure should be as low as possible for proper MOS transistor operation. As the width of the polysilicon gate structure is reduced the sheet resistance of the gate structure rises due in part to the thinner metal silicide regions that are formed on the polysilicon gates using existing fabrication methods. The increased sheet resistance is becoming a major limitation of the MOS transistor performance.

The self-aligned process used to fabricate MOS transistors requires the formation of a sidewall structure prior to the formation of the transistor source and drain regions. Along with the reduction in MOS transistor gate width, the scaling of CMOS technology also requires that the width of the sidewall structures be reduced. The width of the sidewall structure determines how far from the edge of the gate the source and drain regions are formed. During the thermal annealing of the source and drain regions diffusion processes will push the edge of the source and drain regions towards the edge of the transistor gate. Reducing the width of the sidewall structures is therefore limited by the thermal diffusion process that take place during the source drain annealing.

As CMOS technology continues to scale there is therefore an increasing need form methods to reduce the sheet resistance of the MOS transistor gate structure and at the same time reduce the width of the sidewall structure. The instant invention described such a method.

SUMMARY OF THE INVENTION

A dielectric layer and a gate structure are formed on a semiconductor. After any necessary implantation processes, dielectric layers are formed over the gate structure and the semiconductor. The dielectric layers can comprise alternating layers of silicon oxide and silicon nitride. The dielectric layers are anisotropically etched to form initial sidewall structures of a first width $W_1$ adjacent to the gate structure. Source and drain regions are implanted into the semiconductor and the width of the sidewall structures is reduced to $W_2$ using an etch process. Metal silicide regions are formed adjacent to the sidewall structures and on the gate structure following the reduction in the width of the sidewall structure.

The instant invention results in the proper spacing between the edges of the source and drain regions and the MDD regions. In addition the metal silicide region formed on the gate structure has a sufficiently low resistance to ensure proper MOS transistor operation. These and other technical advantages of the instant invention will be readily apparent to one skilled in the art from the following FIGUREs, description, and claims.

BRIEF DESCRIPTION OF THE DRAWINGS

In the drawings.

Corresponding numerals and symbols in the different figures refer to corresponding parts unless otherwise indicated.

DETAILED DESCRIPTION OF THE INVENTION

Figure 1A:
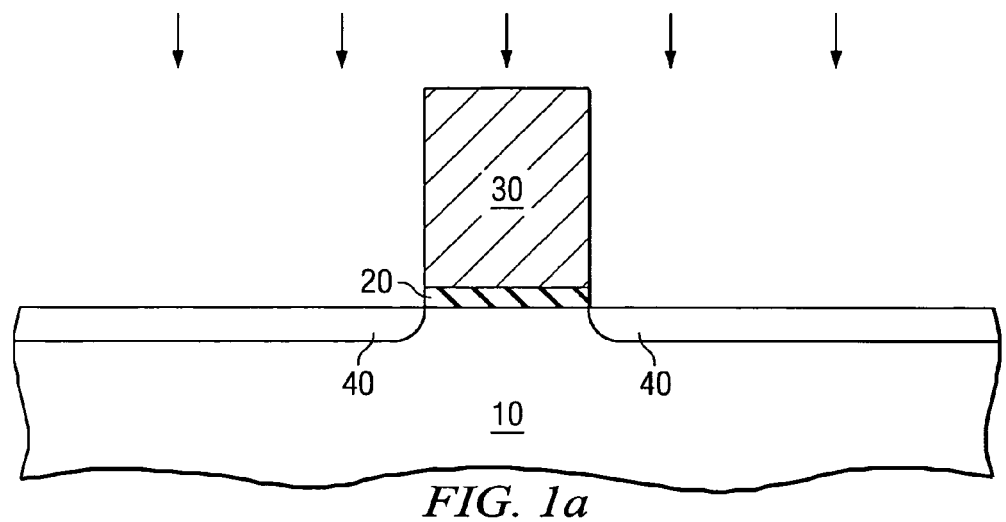
FIGS. 1(a) to FIG. 1(e) are diagrams showing an embodiment of the instant invention.

The instant invention will now be described with reference to an illustrative embodiment shown FIGS. 1(a) to FIG. 1(e). As shown in FIG. 1(a) a MOS transistor dielectric layer 20 and a gate structure 30 are formed on a semiconductor 10. The dielectric layer 20 can be formed using silicon oxide, silicon oxynitride, layers of silicon oxide and silicon nitride, metal oxides such as titanium oxide and tantalum oxide, hafnium oxide, and any other suitable dielectric material. The gate structure 30 can be formed using doped polycrystalline silicon (herein after polysilicon), metals, metal silicides, or any other suitable conducting material. The dielectric layer 20 and the gate structure 30 can be formed using existing integrated circuit manufacturing techniques. Following the formation of the gate structure 30, various dopant species are implanted into the substrate to form the drain-source extension regions, the pocket regions, and any other necessary doped regions. All the doped regions formed in the substrate 10 are shown in the Figures as 40 and will be referred to as the MDD region.

Figure 1B:
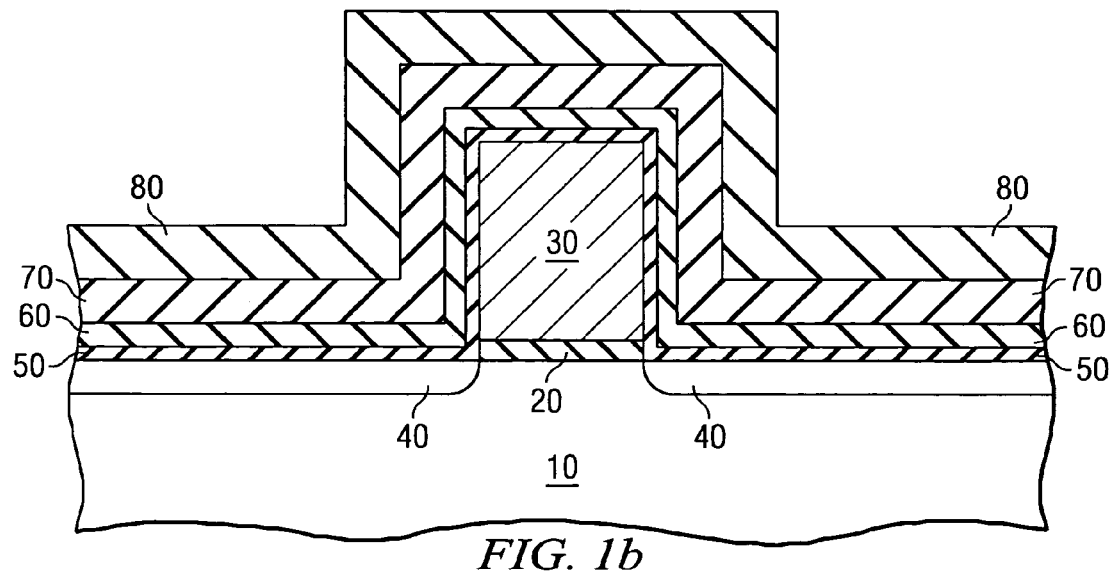

Following the formation of the MDD regions 40, a number of layers are formed over the substrate 10 and the gate structure 30 as shown in FIG. 1(b). In an embodiment of the instant invention a first silicon oxide layer 50 is formed by thermally oxidizing the structure shown in FIG. 1(a). During the thermal oxidation process about 10A to 100A of silicon oxide 50 will be formed on the gate structure 30 and the semiconductor 10. A second silicon oxide layer 60 is formed over the polysilicon oxide layer 50 by a deposition method such as the thermal decomposition of tetraethyl orthosilicate, or TEOS. In addition to TEOS deposition other deposition methods can be used to form the second silicon oxide layer 60. In an embodiment the second silicon layer 60 is about 50A to 200A. A silicon nitride layer 70 is formed over the second silicon oxide layer 60. The silicon nitride layer 70 can be formed using existing manufacturing methods and can be about 150A to about 400A thick. Following the formation of the silicon nitride layer 70, a final silicon oxide layer 80 can be formed over the silicon nitride layer 70. In an embodiment the final silicon oxide layer 80 can be formed using a TEOS deposition method and can be between 400A to 800A thick. The multiple layers shown in FIG. 1(B) will be etched to form the sidewall structures for the MOS transistor. It should be noted that the combination of layers shown in FIG. 1(b) represent only a single embodiment of the instant invention. Other layers can be added or removed from the structure without affecting the scope of the instant invention. For example, an addition silicon nitride layer could be formed between the first silicon oxide layer 50 and the second oxide layer 60.

Figure 1C:
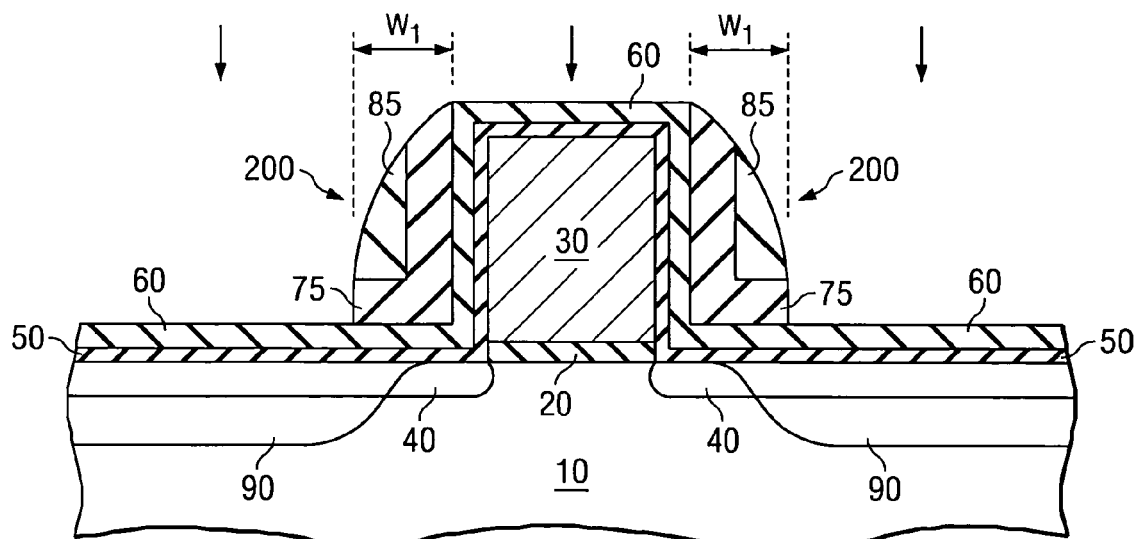

Following the formation of the layers shown in FIG. 1(b) a first anisotropic sidewall etch is performed to form the initial sidewall structures 200 shown in FIG. 1(c). The first anisotropic sidewall etch will remove portions of the layers 70 and 80 leaving the initial sidewall structures 200 shown in the Figure. The silicon nitride region 75 and the silicon oxide region 85 shown in FIG. 1(c) are the remaining portions of the initial silicon nitride 70 and silicon oxide 80 layers respectively. Following the formation of the initial sidewall structures 200, implanting dopant species into the semiconductor 10 forms the transistor source and drain regions 90. The implantation of the dopant species is usually followed by a thermal annealing process that reduces crystalline defects introduced during the implantation process and activates the implanted dopants. The implantation of the dopant species used to form the source and drain regions 90 will be self-aligned to the edge of the initial sidewall structures 200. The width $W_1$ of the initial sidewall structures 200 will determine the distance of the edge of the source or drain region 90 to the edge or the MDD region or alternatively to the edge of the gate structure 30. The width $W_1$ of the initial sidewall structure 200 therefore has to such that a sufficient distance separates the edge of the source and drain regions 90 and the MDD regions 40.

Figure 1D:
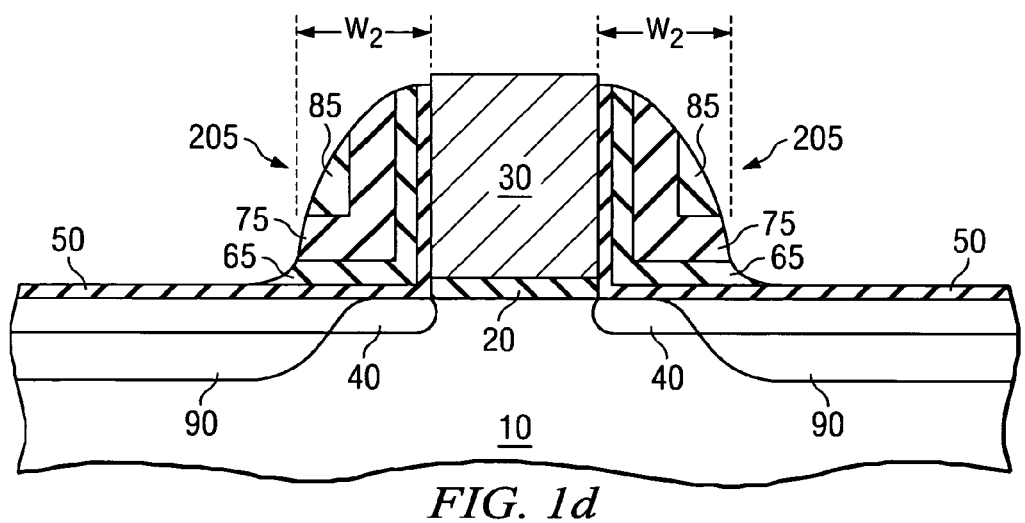

Following the formation of the source and drain regions 90 a second anisotropic sidewall etch is performed to form the final sidewall structures 205 shown in FIG. 1(d). The second anisotropic etch process results in a width of the final sidewall structures $W_2$, where $W_2$ is less than $W_1$. In an embodiment of the instant invention the second anisotropic etch process comprises a timed silicon nitride etch and a timed silicon oxide etch. The silicon nitride etch comprises $CHF_3$, and oxygen flowing in a plasma reactor with RF power between 150 Watts and 350 Watts, and pressure of about 100 mTorr. The silicon oxide etch comprises argon, $CHF_3$, and $CF_4$ flowing in a plasma reactor with RF power between 200 Watts and 400 Watts, and pressures of about 50 mTorr.

During the second anisotropic sidewall etch process, in addition to the reduction in width, the height of the final sidewall structure 205 is now less that the height of the gate structure 30. This reduction in the height of the final sidewall structure exposes a larger area of the gate structure 30 during the subsequent metal silicidation process that results in a thicker silicide layer being formed. The thicker silicide layer will result in a lower sheet resistance and improved MOS transistor performance. The reduction in the width of the final sidewall structure 205 allows the MOS transistors to be packed closer together without contact misalignment. The close packing of the MOS transistors is a major driving force behind the scaling of CMOS technology further into the sub-micron regime.

Figure 1E:
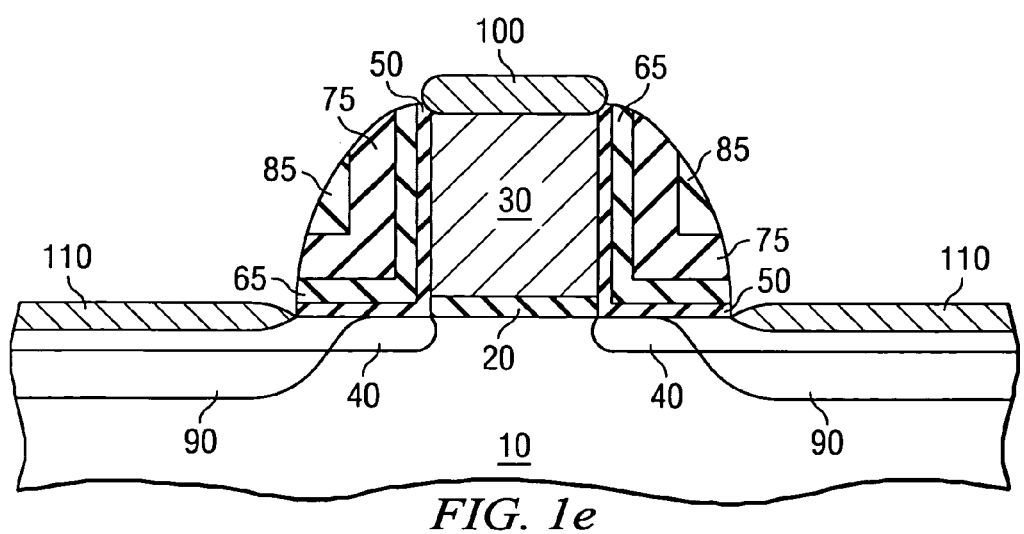

Shown in FIG. 1(e) is the structure of FIG. 1(d) following the formation of the metal silicide regions 100 and 110. The metal silicide regions 100 and 110 can be formed using metals such as cobalt, titanium, nickel or any suitable metal. The silicide regions 100 and 110 are typically formed by depositing a blanket layer of metal followed by silicide formation, strip, and anneal processes. As described above one advantage of the instant invention is that the metal silicide region 100 formed on the gate structure 30 has increased thickness. The increased thickness of the silicide region 100 results in a lower overall sheet resistance for the MOS transistor gate structure 30. The silicide regions 110 are formed on the transistor source and drain regions 90.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. A method for forming a MOS transistor, comprising:
   forming a gate structure of a first height over a semiconductor body;
   forming a first sidewall structure layer over the gate structure and over source/drain regions in the semiconductor body adjacent to the gate structure;
   forming a second sidewall structure layer over the first sidewall structure layer;
   patterning the second sidewall structure layer, thereby removing the second sidewall structure layer over the first sidewall structure layer on a top portion of the gate structure and over the source/drain regions, and thereby defining an aggregate sidewall structure having a first width and a first height; and
   patterning the first sidewall structure layer and a portion of the remaining second sidewall structure layer in the aggregate sidewall structure, thereby exposing the top portion of the gate structure and reducing a width of the aggregate sidewall structure to a second width, and reducing a height of the aggregate sidewall structure to a second height.

2. The method of claim 1, wherein the first sidewall structure layer comprises a bi-layer comprising first and second silicon oxide layers.

3. The method of claim 1, wherein the second sidewall structure layer comprises a bi-layer comprising a silicon nitride layer and a silicon oxide layer formed thereover.

4. The method of claim 1, further comprising:
   forming a conductive layer over at least the exposed top portion of the gate structure;
   performing a thermal process, thereby causing a silicide to form on the exposed top portion of the gate structure; and
   removing any nonreacted conductive material from the top portion of the gate structure.

5. The method of claim 4, wherein the conductive layer is formed over the source/drain regions of the semiconductor body, and wherein the thermal process comprises forming a silicide on the exposed source/drain regions.

* * * * *